US007217404B2

(12) United States Patent
Ajayan et al.

(10) Patent No.: US 7,217,404 B2
(45) Date of Patent: May 15, 2007

(54) METHOD OF TRANSFORMING CARBON NANOTUBES

(75) Inventors: Pulickel M. Ajayan, Clifton Park, NY (US); Ramanath Ganapathiraman, Clifton Park, NY (US); Andres de la Guardia, Panama City, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 591 days.

(21) Appl. No.: 10/367,971

(22) Filed: Feb. 19, 2003

(65) Prior Publication Data

US 2003/0183504 A1 Oct. 2, 2003

Related U.S. Application Data

(60) Provisional application No. 60/358,082, filed on Feb. 19, 2002.

(51) Int. Cl.
*D01F 9/12* (2006.01)
(52) U.S. Cl. .................... 423/447.1; 977/842; 977/847
(58) Field of Classification Search ................ 423/460, 423/447.1; 977/847, 842
See application file for complete search history.

(56) References Cited

U.S. PATENT DOCUMENTS

| 6,128,214 | A | * | 10/2000 | Kuekes et al. .............. 365/151 |
| 6,203,864 | B1 | | 3/2001 | Zhang et al. |
| 6,280,677 | B1 | * | 8/2001 | Yakobson .................... 264/430 |
| 6,659,598 | B2 | * | 12/2003 | Grimes et al. ................ 347/77 |
| 2001/0001681 | A1 | | 5/2001 | Zhang et al. |
| 2004/0038251 | A1 | | 2/2004 | Smalley et al. |
| 2004/0051432 | A1 | | 3/2004 | Jiang et al. |
| 2004/0061422 | A1 | | 4/2004 | Avouris et al. |

FOREIGN PATENT DOCUMENTS

WO        WO 99/33084        7/1999

OTHER PUBLICATIONS

Ajayan et al., "Nanotubes in a Flash-Ignition and Reconstruction", *SCIENCE*, Apr. 26, 2002, p. 705, vol. 296, http:/www.sciencemag.org.
Bockrath et al., "Igniting Nanotubes with a Flash", *Science*, vol. 297, No. 5579. Issue of Jul. 12, 2002, pp. 192-193, Accessed: Feb. 19, 2003, http://www.sciencemag.org/cgi/content/full/297/5579/192.
Boyd, "Carbon Nanotubes Found to Fluoresce", *Rice News Release*, Jul. 29, 2002, Accessed: Feb. 13, 2003, http:/www.rice.edu/projects/reno/Newsreel/2003/20020729_fluoresce.shtml.
Boyd, "Researchers discover promising property of nanotubes", *Rice News*, Sep. 5, 2002, vol. 12, No. 3, Accessed: Feb. 13, 2003, http:/www.rice.edu/projects/reno/rn/20020905/nanotubes.html.
Boyd, "Rice Deciphers Optical Spectra of Carbon Nanotubes", *Rice News Release*, Nov. 28, 2002, Accessed: Feb. 13, 2003, http:/www.rice.edu/projects/reno/Newrel/2003/20021128_spectra.shtml.
O'Connell et al., "Band Gap Fluorescence from Individual Single-Walled Carbon Nanotubes", *Science*, Jul. 26, 2002, pp. 593-6, vol. 297, http:/www.sciencemag.org.
Zhang, et al, Elastic response of carbon nanotube bundles to visible light, *Phys. Rev. Lett.*, vol. 82, pp. 3472-3475, 1999.
Chen, H. and Diebold, G., "Chemical generation of acoustic waves: a giant photoacoustic effect." *Science* 270, 963-966 (1995).
Nikolaev, P., Thess, A., Rinzler, A.G., Colbert, D.T., Smalley, R.E., "Diameter doubling of single-wall nanotubes" *Chem. Phys. Lett.* 266, 422-426 (1997).
Terrones, M., Terrones, H., Banhart, F., Charlier, J.C., Ajayan, P.M. "Coalescence of single-walled carbon nanotubes" *Science* 288, 1226-1229 (2000).
Iijima, S., Yudasaka, M., Yamada, R., Bandow, S., Suenaga, J., Kokai, F., Takahashi, K., "Nano-aggregates of single-walled graphitic carbon nano-horns." *Chem. Phys. Lett.* 309, 165-170 (1999).
Structure-Assigned Optical Spectra of Single-Walled Carbon Nanotubes, Sergei M. Bachilo, et al., Science, 298, pp. 2361-65 (Dec. 20, 2002).
Electrically Induced Optical Emission from a Carbon Nanotube FET, J.A. Misewich, et al, Science vol. 300, May 2, 2003.
Purcell S.T. et al., "Hot Nanotubes: Stable Heating of Individual Multiwall Carbon Nanotubes to 2000K Induced by the Field-Emission Current," APS Journals, Physical Review Letters, Feb. 20, 2002, 2 pgs. Abstract, http://link.aps.org/abstract/PRL/v88/e105502.
Schewe P. et al., "Nanotubes are Hot," American Institute of Physics, Physics News Update, No. 580 #2, Mar. 13, 2002, Abstract, http://www.aip.org/enews/physnews/2002/split/580-2.html.
László Forró et al.; Physical Properties of Multi- Wall Nanotubes; Carbon Nanotubes—Synthesis, Structure, Properties and Applications; 2001; pp. 329-390; Springer-Verlag Berlin Heidelberg, Germany.

* cited by examiner

*Primary Examiner*—Stuart Hendrickson
(74) *Attorney, Agent, or Firm*—Foley & Lardner LLP

(57) ABSTRACT

A method of transforming a carbon single wall nanotube (SWNT) is provided. The method comprises exposing the SWNT to light having a power sufficient to ignite or reconstruct the SWNT such that the SWNT is ignited or reconstructed by the exposure to the light.

21 Claims, 8 Drawing Sheets

METHOD OF TRANSFORMING CARBON NANOTUBES

CROSS-REFERENCE TO RELATED PATENT APPLICATIONS

The present application claims benefit under 35 U.S.C. §119(e) of U.S. provisional application No. 60/358,082, filed Feb. 19, 2002 which is incorporated herein by reference in their entirety.

STATEMENT REGARDING FEDERALLY SPONSORED RESEARCH OR DEVELOPMENT

This invention was made with government support under U.S. Department of Defense Contract No. N000140010250. The government has certain rights in the invention.

BACKGROUND OF THE INVENTION

The present invention relates generally to carbon nanotubes and more particularly to transforming carbon nanotubes using light.

Ten years after their discovery, carbon nanotubes continue to reveal fascinating features. Single-walled carbon nanotubes (SWNTs) have a range of remarkable mechanical and electronic properties due to their unique structure, as discussed in Dresselhaus, M. S., Dresselhaus, G., Avouris, P. "Carbon nanotubes: synthesis, structure, properties, and applications," Springer, Berlin, New York (2001). There has been a previous study on the elastic response (deformation) of nanotubes to visible light, as discussed in Zhang, Y. and Iijima, S. "Elastic response of carbon nanotube bundles to visible light", Phys. Rev. Lett. 82, 3472–3475 (1999). In other words, the authors of this study report that the nanotubes elastically deformed in response to irradiation by light and then returned to their original shape.

BRIEF SUMMARY OF THE INVENTION

A preferred aspect of the present invention provides a method of transforming a single-walled carbon nanotubes (SWNT). The method comprises exposing the SWNT to light having a power sufficient to ignite or reconstruct the SWNT, such that the SWNT is ignited or reconstructed by the exposure to the light.

Another preferred aspect of the present invention provides a method of obtaining light emission from a nanotube, comprising exposing the nanotube to a first light such that the nanotube emits a second light due to the exposure to the first light.

Another preferred aspect of the present invention provides a device, comprising a device shell and a plurality of single-walled carbon nanotubes (SWNTs) located in the device shell. The device is adapted to perform a function when the SWNTs are ignited or reconstructed by exposure to light having a power sufficient to ignite or reconstruct the SWNTs.

DETAILED DESCRIPTION OF THE EMBODIMENTS

Figure 1A:
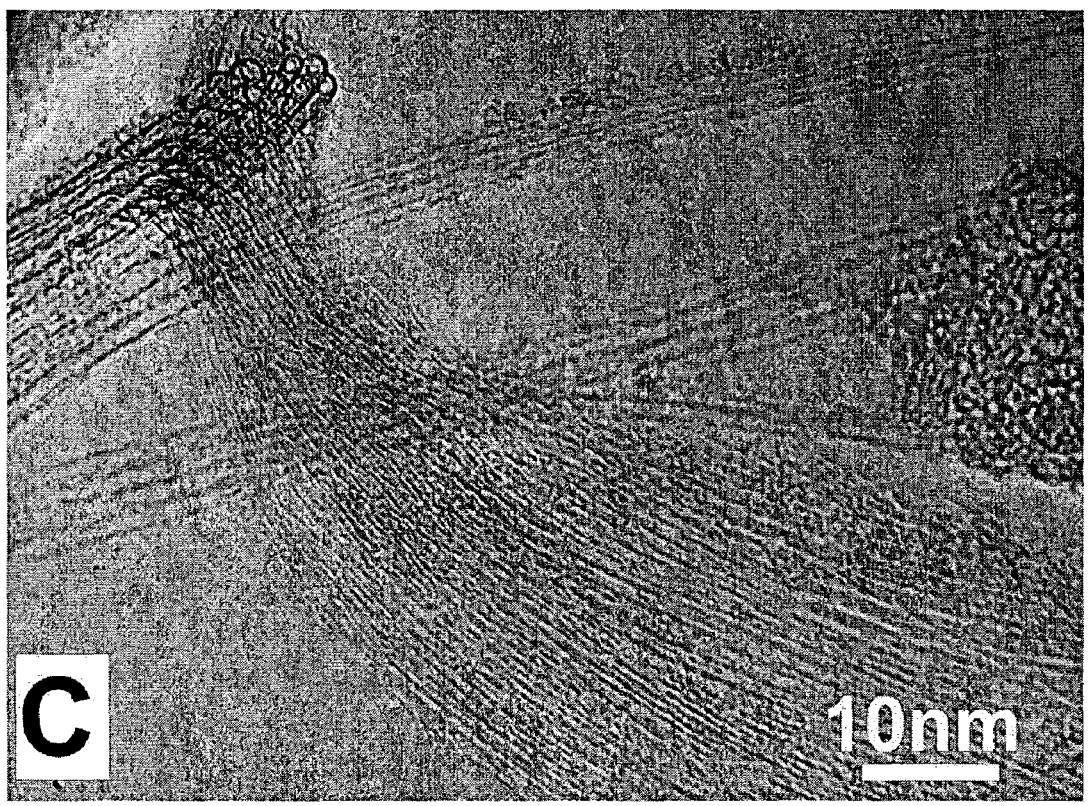
FIGS. 1A and 1B are TEM images of SWNT material.

The present inventors discovered that single-walled carbon nanotubes (SWNTs) can be transformed by exposing a plurality of SWNTs to light having a power sufficient to ignite or reconstruct the plurality of SWNTs. The term "reconstruct" as used herein means a permanent structural reconstruction, where the nanotube structure is permanently changed to a non-nanotube structure, rather than merely elastically deforming the nanotubes with subsequent recovery of the nanotube structure.

Any light having a suitable power may be used to transform the SWNTs, such as visible, infrared or ultraviolet light. Preferably, a flash of light is used to transform the SWNTs. For example, the present inventors have discovered that SWNTs ignite when exposed to a standard photographic flash at a temperature below SWNT ignition temperature, such as at room temperature. However, other light sources, such as commercial flash lamps used in materials processing and rapid thermal annealing may also be used. Also temperatures below SWNT ignition temperature other than room temperature may also be used if desired.

The average power required for ignition of SWNTs varies depending on the SWNT density and ambient in which the SWNTs are located. For example, the average power required for ignition of SWNTs in the presence of air is only about 100 mW/cm$^2$ (±20 mW) for a sample density of about 0.2 g/cm$^3$ for a pulse of visible light having a rise time of 50 µs and a decay time 1.2 ms. When the sample is compacted to higher densities, larger power is needed in order to ignite the SWNT material. For example, for SWNT densities of greater than 1 g/cm$^3$, ignition occurs at about 300 mW/cm$^2$.

A large photo-acoustic effect, observed in other carbon structures, is also associated with the ignition phenomenon. The present inventors noted that ignition is inhibited if the SWNTs sample is densified and that ignition is not observed at available powers for multi-walled nanotubes, graphite powder, carbon soot or $C_{60}$.

Surprisingly, even in the absence of ignition, SWNTs undergo total structural reconstruction in the presence of air, vacuum, or inert gases, upon exposure to a light flash of a sufficient power lower than a power required for ignition. The reconstruction occurred at a temperature below a temperature which SWNTs are reconstructed (i.e., converted to amorphous carbon or other carbonaceous material). The ignition and reconstruction phenomena, witnessed after the absorption of light, are sensitive to the competition between the high thermal conductivity along the carbon nanotube axes, which may lead to intense local heating, versus loss of thermal energy into the bulk, including the surrounding gas. The photo-induced transformation effects demonstrate how the SWNT materials structured on the nanometer scale give rise to surprising properties compared to bulk materials.

When SWNTs are exposed to the suitable light flash, such as a standard camera flash, to ignite, the ignited SWNTs burn leaving behind a small amount of residue consisting of oxidized metal particles used for the catalytic growth of SWNTs and carbonaceous material. The carbonaceous material comprises mostly amorphous and partially graphitized carbon as well as carbon nanohorns. After flashing the SWNTs, there is also an associated photo-acoustic effect caused by the absorption of incident light on the sample and the subsequent rapid rise of heat within the SWNTs, leading to expansion and contraction of trapped gases, thus generating acoustic waves, see Chen, H. and Diebold, G., "Chemical generation of acoustic waves: a giant photoacoustic effect." *Science* 270, 963–966 (1995).

The present inventors have found that this photo effect transformation occurs for all SWNTs samples whether prepared by the electric arc, laser ablation or chemical vapor deposition, when these samples are exposed to a camera flash at close range (several cm away from the sample). All specimens with low nanotube yield, such as samples containing nanotube fractions of about 50% and samples that are essentially pure nanotubes, for example, powder samples commercially available from the HiPCo process, containing nanotube volume fractions of greater than 90%, ignite in air. The photo induced transformation occurred on dry, "fluffy", as-prepared nanotube samples, as will be described in more detail in the specific example section below. However no ignition was observed in multi-walled nanotubes (catalytically grown or arc-produced), $C_{60}$, graphite powder or carbon soot collected from the evaporation of graphite electrodes. The present inventors believe that the observation of SWNT photo ignition is the first report on photo-induced burning of any materials caused by a flash of light.

The ignition and burning of SWNTs occur when local increases in temperature are sufficient to initiate the oxidation of the carbon, and propagate as more heat is released by this exothermic reaction. In order to understand the necessary conditions for ignition and the damage inflicted on the tubes, samples were subjected to light flashes under various environments and analyzed by transmission electron microscopy (TEM). In air, the average light power needed to ignite a SWNT sample was found to be 100 mW/cm$^2$ (±20 mW) for a sample density of about 0.2 g/cm$^3$. The rise time of the pulse was 50 μs and the decay time 1.2 ms. When the sample is compacted to higher densities, larger power is needed in order to ignite the SWNT material. For example, for densities greater than 1 g/cm$^3$, ignition occurs at about 300 mW/cm$^2$. Without wishing to be bound by any particular theory, the present inventors believe that it is more difficult to ignite the denser samples because of the lack of oxygen access and loss of heat into the bulk of the denser samples.

Figure 1B:
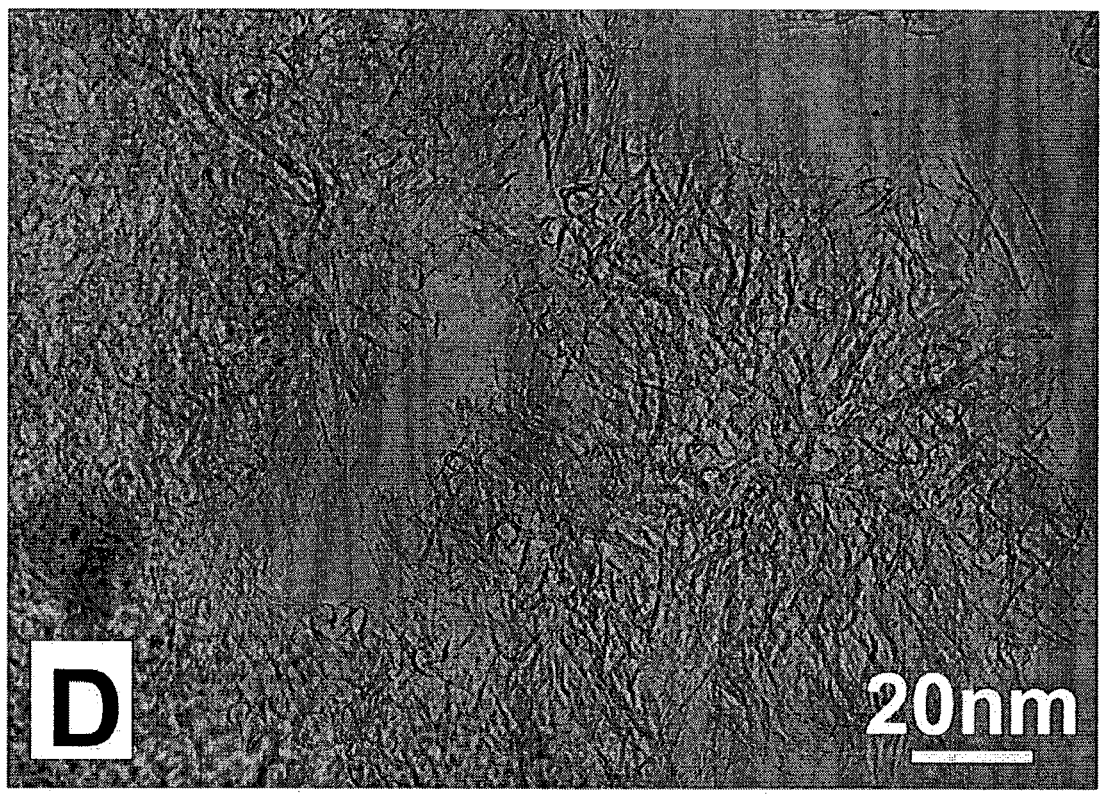

The SWNTs form bundles which criss-cross each other in the pristine sample, as shown in FIG. 1A, which is a TEM image of SWNT material produced by the arc discharge technique described in Journet, C., Maser, W. K., Bernier, P., Loiseau, A., delaChapelle, M. L., Lefrant, S., Deniard, P., Lee, R., Fischer, J. E., "Large-scale production of single-walled carbon nanotubes by the electric-arc technique" Nature 388, 756–758 (1997). FIG. 1B is an image of remnants of transformed SWNT bundles after they have been exposed to a flash of light.

Without wishing to be bound by any particular theory, the present inventors believe that the heat pulse generated by the absorption of light flash will initially be confined to the tubes in a bundle, especially along their axes. Thermal conductivity of nanotubes along the tube axes is expected to be very high as it is along the planes of graphite. See Hone, J., Batlogg, B., Benes, Z., Johnson, A. T., Fischer, J. E., "Quantized phonon spectrum of single-wall carbon nanotubes." Science 289, 1730–1733 (2000), and Berber, S., Kwon, Y. K., Tomanek, D. "Unusually high thermal conductivity of carbon nanotubes." Phys. Rev. Lett. 84, 4613–4616 (2000). As the material is compacted, such as the dense bucky paper obtained after purification and infiltration of nanotubes, more and more bundles are in contact with each other, and the heat is rapidly dissipated into the bulk. In other words, the high energy densities needed for ignition are most easily attained when the bundles are separated, surrounded by oxygen, and the heat wave is locally confined in the nanotube structures.

Since carbon materials, such as nanotubes, oxidize readily at about 700 to 800° C., it may be assumed that the samples reached such temperatures at the light power threshold necessary for ignition. The oxidation temperature of nanotubes is discussed, for example, in Ajayan, P. M., Ebbesen, T. W., Ichihashi, T., Iijima, S., Tanigaki, K. & Hiura, H., "Opening carbon nanotubes with oxygen and implications for filling" Nature 362, 522–525 (1993) and in Tsang, S. C., Harris, P. J. F., Green, M. L. H. "Thinning and opening of carbon nanotubes by oxidation using carbon-dioxide" Nature 362, 520–522 (1993). Without wishing to be bound by any particular theory, the present inventors believe that while this might be at least the average temperature of the sample, locally the temperature may be much higher in order for the extensive reconstruction to occur. Typically graphitic carbon materials are annealed at temperatures approaching 2800° C. because of the inherent strength of C=C covalent bond. SWNTs are known to fuse into large tubes at temperatures between 1500 and 2000° C., as discussed in Nikolaev, P., Thess, A., Rinzler, A. G., Colbert, D. T., Smalley, R. E., "Diameter doubling of single-wall nanotubes" Chem. Phys. Lett. 266, 422–426 (1997) and Terrones, M., Terrones, H., Banhart, F., Charlier, J. C., Ajayan, P. M. "Coalescence of single-walled carbon nanotubes" Science 288, 1226–1229 (2000). For example, on fast annealing of SWNTs at about 1500° C. in helium atmospheres, one of the present inventors observed that the nanotubes underwent morphological and structural transformation into multi-walled nanotubes and coalesced, larger SWNTs. The reconstruction into novel structures, such as those seen in FIGS. 3A–D, requires bond breakage and rearrangements of several carbon atoms. Therefore, the effective transient temperature within the tubes is probably at least 1500° C., while the ambient temperature is maintained below 1500° C., such as below 700° C., preferably at room temperature of about 25° C.

The effects of a simple camera flash, discussed above, demonstrate how heat confinement in nanostructures can lead to drastic structural effects and induce ignition under exposure to conditions where nothing would have been expected for bulk materials. Nanotubes with single atomic layer thick walls are representative of such extreme confinement and lend themselves well to photo-induced effect with their black color.

The SWNTs may be used in any suitable device in which optically induced SWNT transformation is desired. For example, a device contains a device shell or housing and a plurality single-walled carbon nanotubes (SWNTs) located in the device shell. The device preferably also is adapted to perform a function when the SWNTs are ignited or reconstructed by exposure to light having a power sufficient to ignite or reconstruct the SWNTs.

The photo induced transformation of SWNTs make SWNTs suitable for uses as remote light induced trigger and ignition devices. For example, a trigger device may comprise a fuse, where SWNTs are placed across electrodes. The light irradiation of the SWNTs transforms the nanotube fuse and breaks the electric path between the electrodes. An output section of the trigger device would comprise the electrodes and output circuitry. An ignition device may comprise the nanotubes adjacent to an ignitable, volatile material or gas generating material, such as that used in airbags. The flash of light causes the nanotubes to burn, giving off a spark and igniting the volatile or gas generating material. The nanotubes may be embedded in a fluid or aerosol containing the volatile or gas generating material. The SWNT transformation could also be used possibly to control nanotube reconstruction or linking by adjusting the light power and wavelength (both in the visible or IR for vibrational modes) to select preferentially some tubes over others based on their electronic properties. For example, some nanotubes are semiconducting while others are metallic. Incident light may couple differently to metallic versus semiconducting nanotubes. Thus, semiconducting or metallic nanotubes may be selected based on their electronic structure by appropriately selecting the incident light characteristics.

The photo induced transformation of SWNTs may also be used in a programmable read only memory (PROM) or an electrically programmable read only memory (EPROM). A prior art PROM, which is also known as field programmable memory, utilizes an array of fuses connecting a plurality of conductors or bit lines. The fuses usually comprise a conductive material, such as polysilicon strips. Each fuse corresponds to a storage cell. A laser or other intense light is used to selectively destroy or blow some but not other fuses in the array. In other words, the laser is used to melt the polysilicon strips to disconnect the bit lines at some storage cell locations but not at other locations to form the nonvolatile memory device. A blown storage cell corresponds to a "0" data bit, while an intact storage cell corresponds to a "1" data bit. By selectively blowing some storage cells, a pattern of 1 and 0 data bits is stored in the PROM. The data is later read out by applying a read voltage to the bit lines and detecting a current flow between the bit lines.

A prior art EPROM usually utilizes an array of floating gate transistors. The EPROM is electrically programmed by applying a voltage between a source and a drain or between a source and a control gate of a particular transistor to inject electrons into the floating gate. The stored electron charge in the floating gate alters the threshold voltage of a particular transistor, changing its memory state from "0" to "1". The transistors of the EPROM are erased by masking certain transistors and leaving other transistors unmasked, and exposing the EPROM to UV. The UV removes the charge stored in the floating gates of the unmasked transistors, changing their memory state from "1" to "0". The programmed masked transistors retain the "1" memory state.

Figure 4:
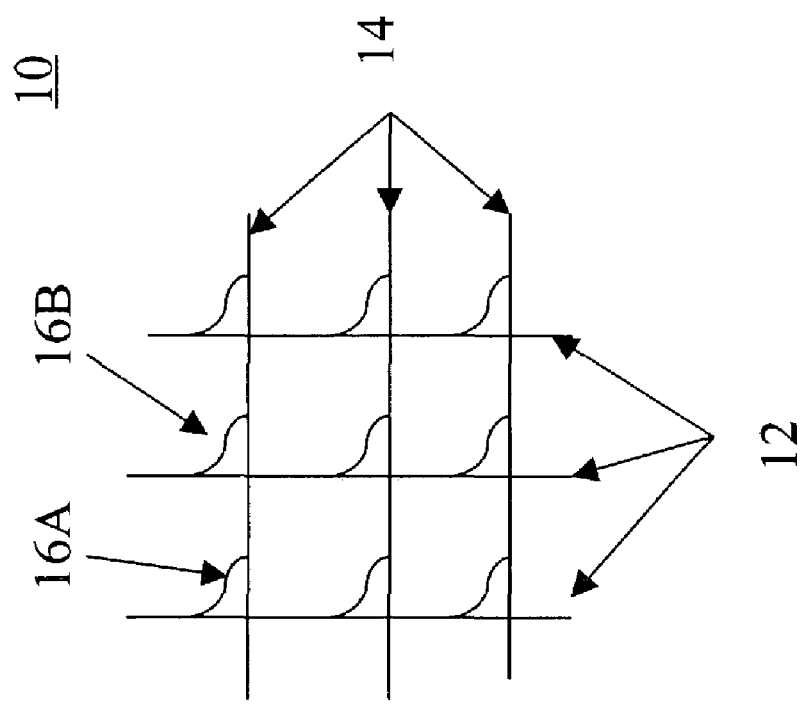
FIG. 4 is a schematic of a memory device utilizing SWNTs.

In a preferred aspect of the present invention, SWNTs may be used to replace fuses and floating gate transistors in a PROM and an EPROM, respectively. For example, in a PROM, at least one SWNT, such as an array of SWNT bundles, is used to connect a plurality of conductors or bit lines. In one preferred, non-limiting embodiment shown in FIG. 4, the PROM 10 may be arranged in a classic cross bar architecture. In this architecture, intersecting bit lines 12 and 14 arranged at about 90 degree angles and connected at storage cell locations by SWNT bundles 16A, 16B. The vertical bit lines 12 are not otherwise electrically connected to the horizontal bit lines 14. The unprogrammed PROM array has "1" stored in each storage cell location because the SWNT bundles provide an electrical connection between adjacent bit lines 12, 14.

To program the PROM 10, light (i.e., visible, UV or IR) is selectively applied to some but not other storage cell locations to selectively transform (i.e., ignite or reconstruct) some SWNT bundles but not others SWNT bundles. For example, light, such as a flash of white light, may be used to transform SWNT bundle 16A but not bundle 16B. The light may be selectively applied to different SWNT bundles by focusing the light to the dimension of one bundle. The focused light may be scanned across the PROM array 10 and selectively turned on only over selected SWNT bundle locations. Alternatively, the light may be selectively applied by selectively masking some but not other SWNT bundles. For example, a photoresist mask may be formed over selected SWNT bundles. Alternatively, a solid, opaque mask, such as a metal, glass or plastic mask, with transparent portions or windows, may be interposed between the light source and the PROM 10. The entire PROM 10 or part of the PROM 10 is then irradiated with the light to transform the unmasked SWNT bundles. The step of exposing the SWNT to light having a power sufficient to ignite or reconstruct the SWNT causes the SWNTs to disconnect the bit lines. The transformed SWNT bundles are converted from a "1" to a "0" memory state because the transformed SWNT bundles no longer provide an electrical contact between adjacent bit lines 12, 14. The PROM also contains an output section which comprises a peripheral circuit adapted to output a read signal, similar to a peripheral or driver circuit used in semiconductor PROMs. The peripheral circuit may comprise a CMOS logic circuit for example.

The array 10 may also be made as an EPROM. In this case, the SWNT bundles 16A, 16B may be made to shift to contact or not contact adjacent bit lines 12, 14 by passing a current through the bit lines. The current causes the SWNTs to shift, creating and open or closed circuit. The EPROM is erased by selectively exposing the SWNT bundles 16A or 16B to light to transform the irradiated bundles. The EPROM also contains an output section which comprises a peripheral circuit adapted to output a read signal, similar to a peripheral or driver circuit used in semiconductor EPROMs.

SPECIFIC EXAMPLES

Figures 2A, 2B, 2C, 2D, 2E:
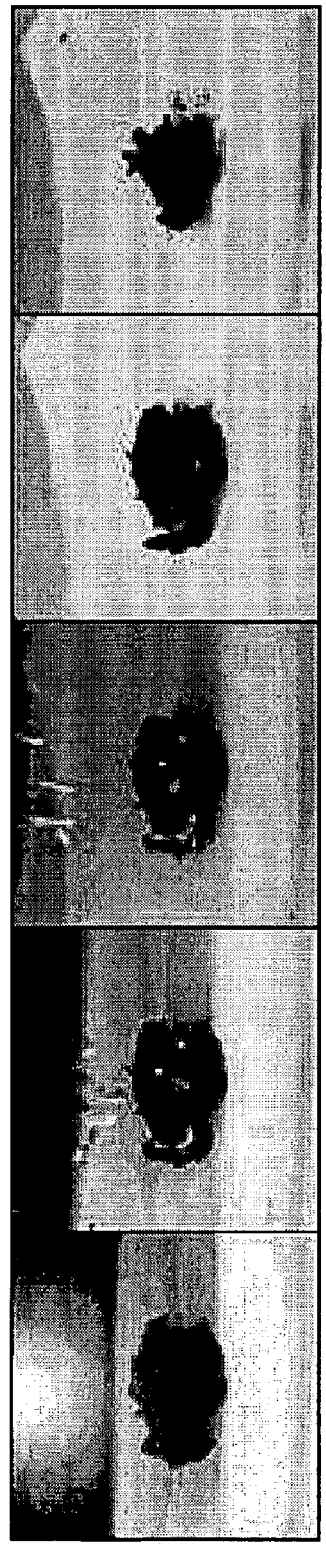
FIGS. 2A–E illustrate a sequence of frames taken from a real-time video recording of SWNT burning phenomena after the application of a photography flash in air.

The ignition and burning of SWNTs exposed to a photo flash of white light are shown in FIGS. 2A–E. FIGS. 2A–E depict a sequence of four frames taken from a real-time video recording of burning SWNTs made by the HiPCo process after the application of the photo flash. The SWNTs were located in an air ambient at room temperature. FIG. 2A illustrates the original SWNT sample showing the flash on top of about 2 cm outside diameter. Immediately after the flash, several red spots were observed on the sample. FIGS. 2B and 2C show the sample soon after flashing exhibiting the ignited SWNT material with red and yellow spots. FIG. 2D shows the sample during burning depicting only red spots (i.e., the red-hot regions within the sample). As the sample then burns down in air, it generates CO and $CO_2$, and leaves behind residues comprising oxidized catalyst particles, such as Ni—Y or Fe, utilized for SWNT synthesis (a red powder) as well as carbonaceous materials (a black material), which are shown in FIG. 2E. Without wishing to be bound by a particular theory, the present inventors believe that it is highly possible that although conduction along the tube axis is high, the contacts (bad thermal contacts) between bundles and individual nanotubes could act as "hot" spots, resulting in the formation of hot localized heating centers and acting as ignition triggers in the presence of air.

Thus, the present inventors were able to obtain light emission from a nanotube, such as nanotubes located in a bundle, by exposing the nanotube to first light, such as the photo flash of white light, such that the nanotube emits second light, such as red and yellow light, due to the exposure to the first light. The first light, such as white light, and the second light, such as yellow and red light, comprise light of a different peak wavelength. The second light, such as the red and yellow light was recorded, such as with a video or a still camera.

However, the present invention should not be considered limited by the preferred embodiment described above. For example, the term light may include infrared or ultraviolet radiation in addition to visible light. For example, isolated nanotubes exhibit fluorescence in the infrared range when they are irradiated with visible light from a laser, as discussed in M. J. O'Connell, et al., 297 Science 593 (Jul. 26, 2002), incorporated herein by reference in its entirely. As described in the O'Connell et al. article, single walled, semiconducting nanotubes encapsulated in cylindrical SDS micelles exhibited fluorescence in the 1500 to 875 nm range after being irradiated with a pulsed 532 nm laser. Thus, nanotube bundles and single nanotubes may be used to emit light.

The reconstruction of SWNTs exposed to a photo flash in different ambients is illustrated in FIGS. 3A–D. FIGS. 3A–D are high resolution transmission electron microscopy (HRTEM) images of a typical areas of carbonaceous material obtained after flashing SWNTs in different ambients. These Figures reveal that, independent of ignition, the material undergoes surprisingly large structural reconstruction.

Figure 3A:
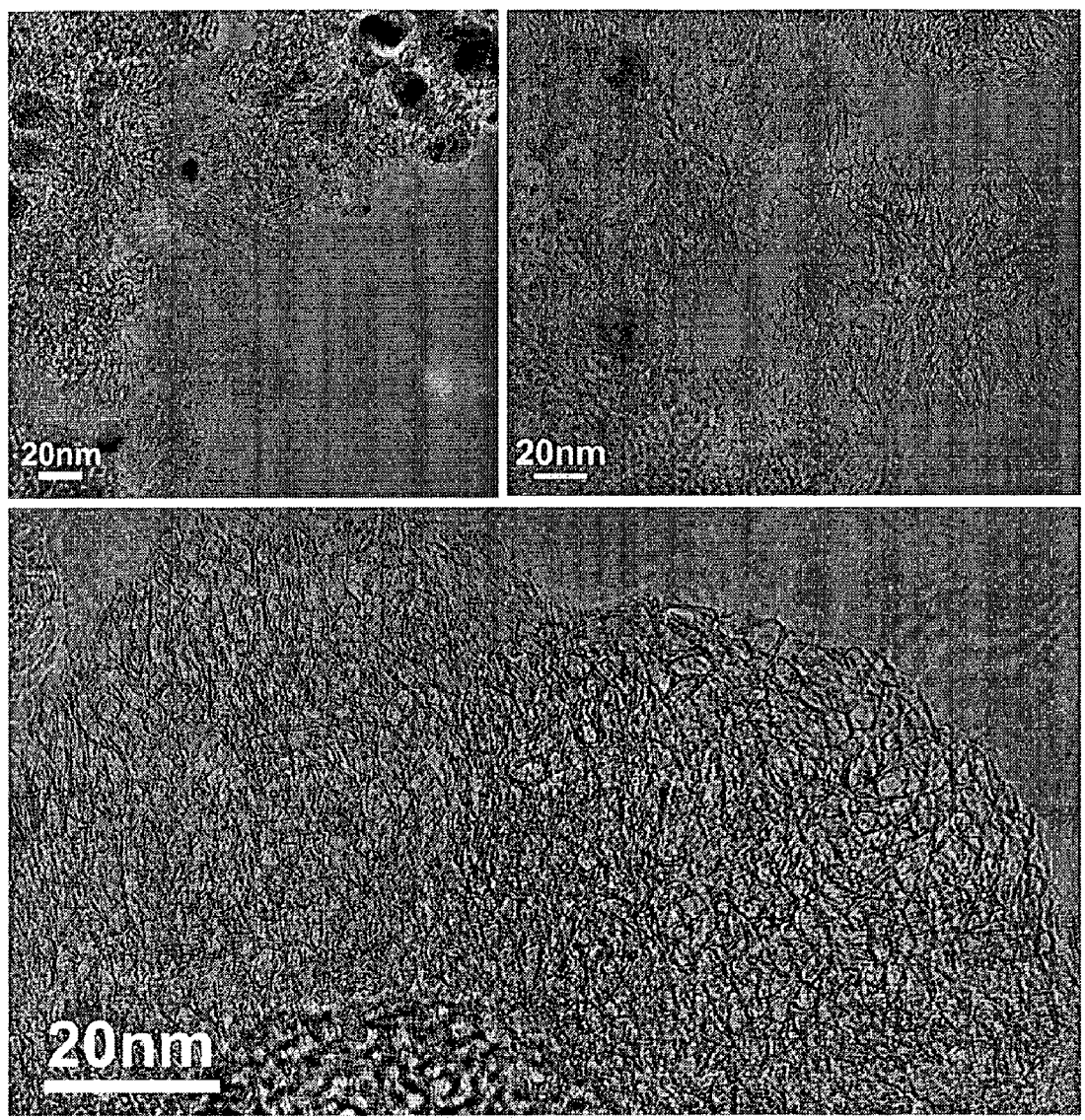
FIGS. 3A–D are HRTEM images of a typical areas of transformed nanotube material obtained after exposing the SWNTs to a flash of light.

The SWNT samples before flashing contained a large amount of SWNT bundles with well defined cross sections. The samples also contain a low yield of carbon nanohorns. Nanohorns are described, for example, in Iijima, S., Yudasaka, M., Yamada, R., Bandow, S., Suenaga, K., Kokai, F., Takahashi, K., "Nano-aggregates of single-walled graphitic carbon nano-horns." Chem. Phys. Lett. 309, 165–170 (1999), incorporated herein by reference. FIG. 3A is a HRTEM image of reconstructed SWNTs that were exposed to a photographic flash in an air ambient at atmospheric pressure and room temperature. In the sample that was exposed to the flash in air, in the absence or presence of ignition, much of the remaining carbon material was transformed into single layered or single walled structures with many conical tips similar to nanohorns. In addition to the nanohorns, some SWNT bundles surrounded by amorphous carbon were observed. Thus, the SWNTs were heavily damaged and metallic particles were embedded in amorphous-like carbon domains, possibly due to the fragmentation of the nanotubes. While a few undamaged SWNTs were observed, no cross sections were observed.

Figure 3B:
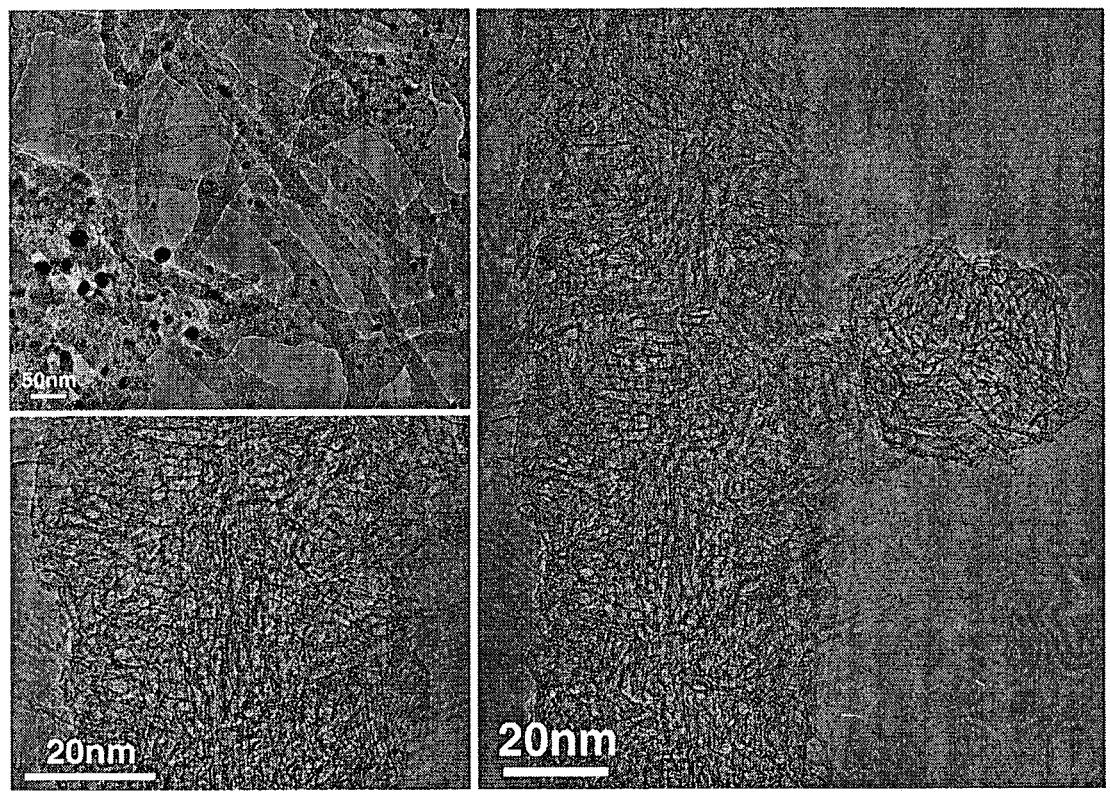

FIG. 3B is a HRTEM image of reconstructed SWNT bundles that were exposed to a photographic flash in an argon ambient. FIG. 3B shows that after the flashing and reconstruction, filamentous structures that are composed of SWNTs in their cores covered by reconstructed curled graphene (amorphous-like) material remain. Thus, the reconstructed sample contained SWNT bundles coated with amorphous carbon as well as areas containing nanohorns and a few "graphitic" domains. The coated bundles appeared crystalline on the inside but were damaged on the outside. However, the SWNTs were not as heavily damaged as in the case of helium ambient described below. The bundle cross sections were easy to find. The present inventors also observed agglomerates of nanohorns around the SWNTs, but at a much lower yield than compared to SWNT bundles reconstructed in a helium ambient under the same conditions, as described below.

Figure 3C:
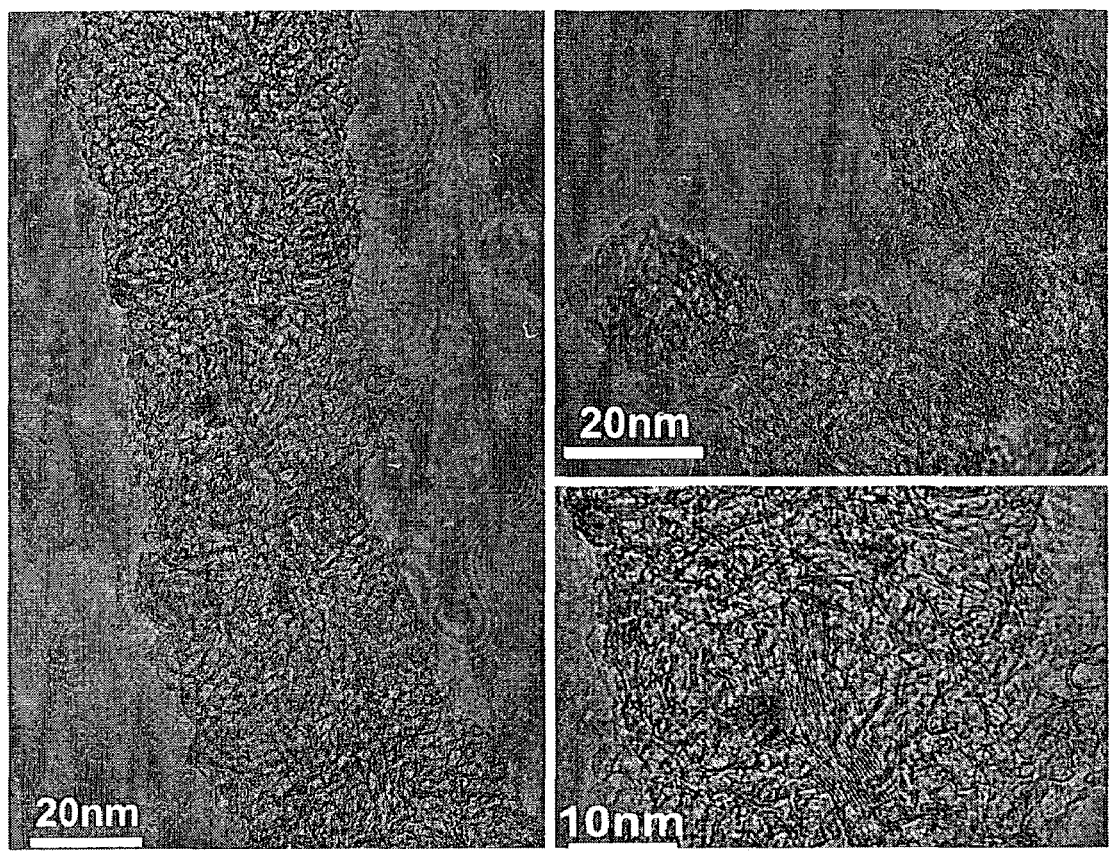

FIG. 3C is a HRTEM image of reconstructed SWNT bundles that were exposed to a photographic flash under a vacuum of about $1 \times 10^{-4}$ Torr. The image shows that the nanotube bundles were totally damaged and no inner nanotube cores were observed. Some graphitic domains, nanohorns and traces of SWNTs were also observed. The experiment was repeated but with five flashes instead of one. The sample was also heavily damaged, and a large number of graphitic domains were present (e.g. 3–8 graphitic layers stacked in random orientations). Some nanohorns and metal particles embedded in amorphous-like carbon material were also observed. SWNTs were only observed in one location, and were severely damaged and exhibited large quantities of amorphous material around the bundles. Thus, the additional flashes resulted in a more several transformation or damage. Furthermore, the additional flashes resulted in additional graphitic domains compared to one flash. This indicates that the SWNTs exposed to five flashes suffered severe reconstruction into flat domains, which tend to be energetically more favorable than curved surfaces.

Figure 3D:
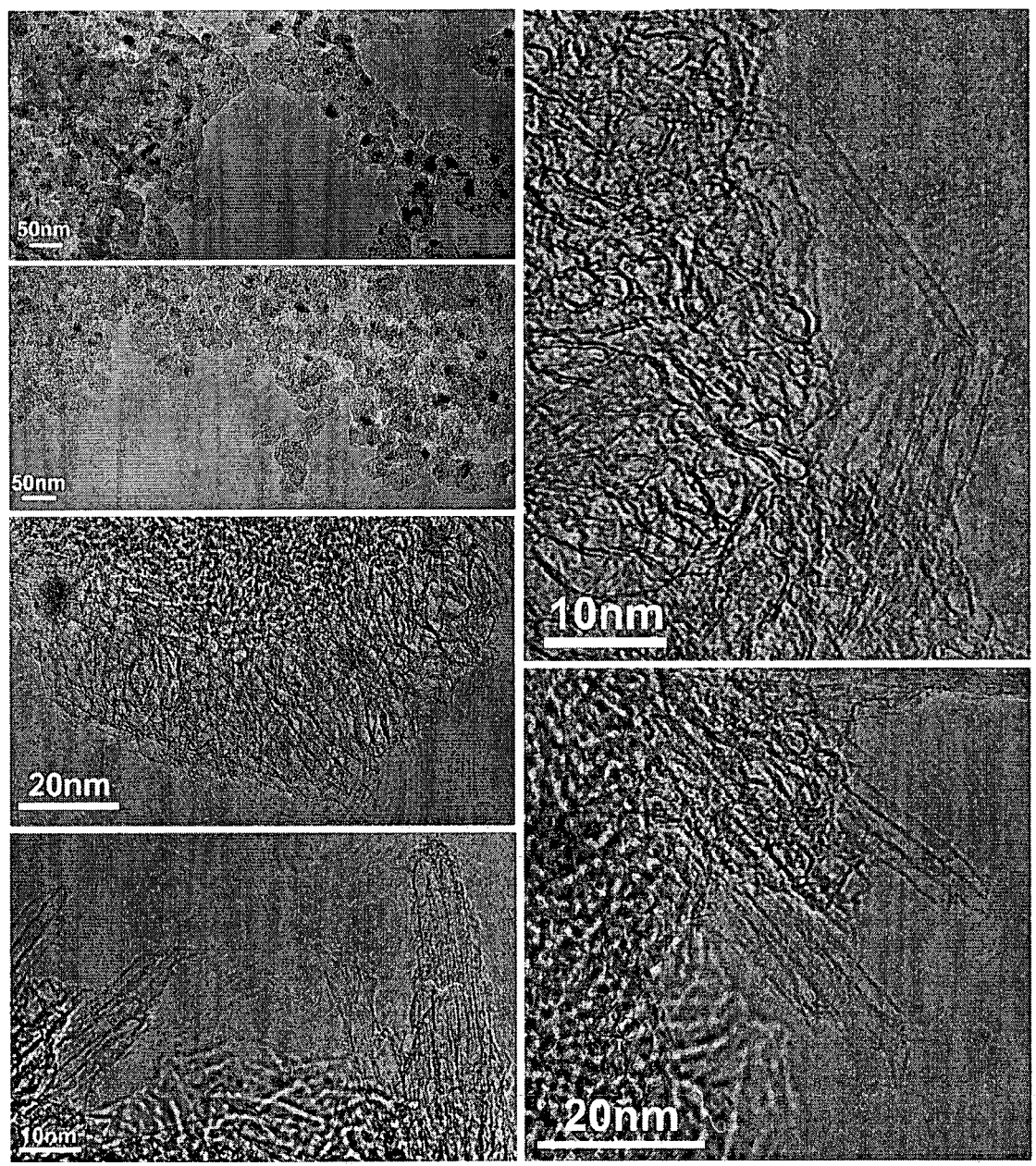

FIG. 3D is a HRTEM image of reconstructed SWNT bundles that were exposed to a photographic flash in a helium ambient. The image shows that the structure exhibits complete destruction of the tubes and formation of a large amount of nanohorns and some graphitic domains (e.g. 3–4 stacked layers in random orientations). More nanohorns but less SWNTs were observed than in the case of the flash under vacuum. The observed SWNTs have been shortened and it was easier to find their tips, which appear to be heavily damaged than in the unflashed SWNT samples. This may be useful for applications where it is important to shorten SWNTs and/or to find SWNT tips.

The SWNT bundles appear to remain at first glance after being flashed under vacuum or in an argon ambient. However, upon closer inspection, the bundles are heavily damaged with significant reconstruction and the appearance of filamentous, partially graphitized and disordered carbon, as shown in FIGS. 3B and 3C. In contrast, the samples in which SWNT bundles that were flashed in a helium ambient exhibit very few nanotubes bundles and large amounts of nanohorn material, as shown in FIG. 3D. Thus, it is possible to form carbon nanohorns by exposing SWNTs to light. Furthermore, the SWNT samples were transformed or damaged by the flash in light on all four ambients.

Without wishing to be bound by a particular theory, the present inventors believe that the difference in reconstructed material may be due to the difference in thermal conductivity of the ambient. Vacuum and argon ambient have a low thermal conductivity compared to helium ambient. For example, argon has a thermal conductivity of 0.0177 $Wm^{-1}K^{-1}$ while helium has a thermal conductivity of 0.152 $Wm^{-1}K^{-1}$. The present inventors believe that much more amorphous material is observed around very damaged nanotubes in argon and vacuum than in helium. In other words more deconstruction than reconstruction takes place in a low thermal conductivity ambient, such as vacuum or argon. In vacuum, several flat graphitic-like domains (3–8 randomly stacked graphitic structures) are also found. In air, a reaction between carbon and oxygen should occur. In this case, the reconstruction takes place but the influence of oxygen may also be important.

Generally, samples treated in the absence of oxygen experience severe reconstruction of the SWNTs, which fragment and reconstruct into metastable carbon nanostructures. These structures are not thermodynamically stable any more than nanotubes. The carbon atoms would tend to form planar graphitic stacks, which appear to be more stable than bent domains. Therefore, as the heat rises in the nanotubes, reconstruction begins and continues as long as the heat is not dissipated. If the heat dissipates fast, such as in a high thermal conductivity ambients, such as helium, the resulting structures are snapshots at different stages of reconstruction. In Ar or in vacuum, where the heat is not carried away so easily, the material continues to deconstruct, reforming into thermodynamically favored single layered graphitic domains. In fact, the structural reconstructions in samples flashed with several consecutive shots leads to the formation of larger stacked "graphitic" domains of 4–10 layers. A higher thermal conductivity of the ambient gas also provides a mechanism for heat spreading through the sample, leading to more uniform structural damage. Another factor that may influence SWNT transformation is the SWNT thermal conductivity, which is relatively high. The contacts of the SWNT bundles may also be a factor in the burning of the SWNT samples. The samples reconstruct and SWNTs transform into a graphene arrangement after flashing, while the presence of air and helium ambient and the way the SWNTs are entangled enhances the effect.

The SWNT samples used in the specific examples include: (a) as grown SWNTs produced using the arc discharge (in 500 Torr He atmospheres) between graphite electrodes loaded with Ni—Y mixtures, see Journet, C., Maser, W. K., Bernier, P., Loiseau, A., delaChapelle, M. L., Lefrant, S., Deniard, P., Lee, R., Fischer, J. E., "Large-scale production of single-walled carbon nanotubes by the electric-arc technique" Nature 388, 756–758 (1997); (b) commercially available SWNTs produced by the HiPCo process, see Nikolaev, P., Bronikowski, M. J., Bradley, R. K., Robmund, F., Colbert, D. T., Smith, A., Smalley, R. E., "Gas-phase catalytic growth of single-walled carbon nanotubes from carbon monoxide" Chem. Phys. Lett. 313, 91–97 (1999); c) as grown SWNTs produced by laser ablation of graphite-Ni—Co mixtures in Ar at 1500° C., see Thess, A., Lee, R., Nikolaev, P., Dai, H. J., Petit, P., Robert, J., Xu, C. H., Lee, Y. H., Kim, S. G., Rinzler, A. G., Colbert, D. T., Scuseria, G. E., Tomanek, D., Fischer, J. E., Smalley, R. E. "Crystalline ropes of metallic carbon nanotubes" Science 273, 483–487 (1996); and (d) Bucky paper purchased from CARBOLEX Inc. (www.carbolex.com). For the microscopy studies of the light-flash experiments in different atmospheres, SWNTs were deposited on TEM copper and silver grids, which were inserted inside optical cells, evacuated, and subsequently purged with ultrahigh purity He or Ar gas (atmospheric pressure). For vacuum samples, the pressure was maintained at $1 \times 10^{-4}$ Torr. High resolution transmission electron microscopy (HRTEM) studies were carried out in a JEOL JEM-4000 microscope operating at 400 kV and a JEOL JEM 2010 operated at 200 kV and equipped with EDX detector and a Gatan multiscan camera.

The foregoing description of the invention has been presented for purposes of illustration and description. It is not intended to be exhaustive or to limit the invention to the precise form disclosed, and modifications and variations are possible in light of the above teachings or may be acquired from practice of the invention. The description was chosen in order to explain the principles of the invention and its practical application. It is intended that the scope of the invention be defined by the claims appended hereto, and their equivalents. All articles mentioned herein are incorporated by reference in their entirety.

What is claimed is:

1. A method of transforming a single-walled carbon nanotube (SWNT) comprising exposing the SWNT to light having a power sufficient to ignite the SWNT, wherein the SWNT is ignited by the light.

2. The method of claim 1, wherein the step of exposing comprises exposing a plurality of SWNTs to a flash of light.

3. The method of claim 2, wherein the flash of light comprises a flash of visible light.

4. The method of claim 3, wherein the flash of light power ranges from about 100 mW/cm$^2$ for SWNT density of about 0.2 g/cm$^3$ to about 300 mW/cm$_2$ for SWNT density of greater than about 1 g/cm$^3$.

5. The method of claim 4, wherein the plurality of SWNTs comprise dry, as-prepared SWNT bundles.

6. The method of claim 5, wherein the plurality of ignited SWNTs are exposed to the flash of light in an air ambient at room temperature and burn to leave oxidized catalyst particles and carbonaceous material.

7. The method of claim 6, wherein the plurality of ignited SWNTs are transformed to single layered carbonaceous structures with conical nanohorn tips.

8. A method of transforming a single-walled carbon nanotube (SWNT) comprising exposing the SWNT to light having a power sufficient to reconstruct the SWNT, wherein the SWNT is reconstructed by the light such that the nanotube structure is permanently changed to a non-nanotube structure.

9. The method of claim 8, wherein the step of exposing comprises exposing a plurality of SWNTs to a flash of light.

10. The method of claim 9, wherein the step of exposing comprises exposing the plurality of SWNTs to a plurality of flashes of light.

11. The method of claim 9, wherein the flash of light comprises a flash of visible light.

12. The method of claim 9, wherein the plurality of SWNTs are exposed to the flash of light in an air ambient and are reconstructed to single layered carbonaceous structures with conical nanohorn tips.

13. The method of claim 9, wherein the plurality of SWNTs are exposed to the flash of light in an absence of oxygen and are reconstructed to metastable carbon nanostructures.

14. The method of claim 13, wherein the plurality of SWNTs are exposed to the flash of light in a vacuum or in an argon ambient and are reconstructed to filamentous, partially graphitized and disordered carbon.

15. The method of claim 13, wherein the plurality of SWNTs are exposed to the flash of light in a high thermal conductivity ambient and are reconstructed to nanohorns.

16. The method of claim 15, wherein the high thermal conductivity ambient comprises a helium ambient.

17. A method of transforming a single-walled carbon nanotube (SWNT) comprising exposing the SWNT to light having a power sufficient to ignite or reconstruct the SWNT, such that the SWNT is ignited or reconstructed by the exposure to the light, wherein:

the SWNT comprises one of a plurality of SWNTs located in a PROM or an EPROM which utilizes SWNT ignition or reconstruction;

the SWNTs connect bit lines in the PROM or EPROM; and the step of exposing the SWNT to light having a power sufficient to ignite or reconstruct the SWNT causes the plurality of SWNTs to disconnect the bit lines.

18. A method of transforming a single-walled carbon nanotube (SWNT) comprising exposing the SWNT to light having a power sufficient to ignite or reconstruct the SWNT, such that the SWNT is ignited or reconstructed by the exposure to the light, wherein:

the SWNT is ignited by the exposure to the light; and the SWNT comprises one of a plurality of SWNTs located in an ignition device which utilizes SWNT ignition.

19. A method of transforming a single-walled carbon nanotube (SWNT) comprising exposing the SWNT to light having a power sufficient to ignite or reconstruct the SWNT, such that the SWNT is ignited or reconstructed by the exposure to the light, wherein:

the SWNT is reconstructed by the exposure to the light such that the nanotube structure is permanently changed to a non-nanotube structure; and the SWNT comprises one of a plurality of SWNTs located in a trigger device which utilizes SWNT reconstruction.

20. A method of transforming a single-walled carbon nanotube (SWNT) comprising exposing the SWNT to light having a power sufficient to ignite or reconstruct the SWNT, such that the SWNT is ignited or reconstructed by the exposure to the light, wherein:

the SWNT is reconstructed by the exposure to the light such that the nanotube structure is permanently changed to a non-nanotube structure; and the SWNT comprises one of a plurality of SWNTs located in a PROM which utilizes SWNT reconstruction.

21. A method of transforming a single-walled carbon nanotube (SWNT) comprising exposing the SWNT to light having a power sufficient to ignite or reconstruct the SWNT, such that the SWNT is ignited or reconstructed by the exposure to the light, wherein:

the SWNT is reconstructed by the exposure to the light such that the nanotube structure is permanently changed to a non-nanotube structure; and the SWNT comprises one of a plurality of SWNTs located in an EPROM which utilizes SWNT reconstruction.

* * * * *